(12) United States Patent
Lee

(10) Patent No.: US 12,261,182 B2
(45) Date of Patent: Mar. 25, 2025

(54) IMAGE SENSING DEVICE

(71) Applicant: SK hynix Inc., Icheon-si (KR)

(72) Inventor: Eun Khwang Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 76 days.

(21) Appl. No.: 18/062,969

(22) Filed: Dec. 7, 2022

(65) Prior Publication Data

US 2024/0072086 A1 Feb. 29, 2024

(30) Foreign Application Priority Data

Aug. 26, 2022 (KR) .......................... 10-2022-0107811

(51) Int. Cl.
*H01L 27/146* (2006.01)
*H04N 25/633* (2023.01)

(52) U.S. Cl.
CPC .. *H01L 27/14623* (2013.01); *H01L 27/14621* (2013.01); *H01L 27/14627* (2013.01); *H01L 27/14636* (2013.01); *H04N 25/633* (2023.01)

(58) Field of Classification Search
CPC ......... H01L 27/14621; H01L 27/14623; H01L 27/14627; H01L 27/14636; H04N 25/633
See application file for complete search history.

(56) References Cited

U.S. PATENT DOCUMENTS

| | | | |
|---|---|---|---|
| 9,159,754 B1* | 10/2015 | Kim | H01L 27/1462 |
| 2014/0110809 A1* | 4/2014 | Kitamura | H01L 27/14623 438/73 |
| 2020/0119072 A1* | 4/2020 | Lim | H01L 27/1463 |
| 2022/0173146 A1* | 6/2022 | Chung | H01L 27/14623 |
| 2023/0017156 A1* | 1/2023 | Kim | H01L 27/14603 |
| 2023/0131769 A1* | 4/2023 | Kim | H01L 27/14689 257/446 |

FOREIGN PATENT DOCUMENTS

| | | |
|---|---|---|
| KR | 20000041448 A | 7/2000 |
| KR | 10-2005-0066739 | 6/2005 |

* cited by examiner

*Primary Examiner* — Amy R Hsu
(74) *Attorney, Agent, or Firm* — Perkins Coie LLP

(57) ABSTRACT

An image sensing device includes an image pixel region including active pixels, each active pixel configured to generate an imaging pixel signal through a photoelectric conversion of incident light received by the active pixel, and an optical black pixel region disposed separately from the image pixel region and including a plurality of black pixels and a light blocking layer that blocks incident light from entering the black pixels, each black pixel configured to generate a black pixel signal for correcting dark current. The image pixel region includes a condensing lens layer configured to condense the incident light, and the optical black pixel region includes a dispersion lens layer configured to disperse the incident light.

19 Claims, 11 Drawing Sheets

IMAGE SENSING DEVICE

CROSS-REFERENCE TO RELATED APPLICATION

This patent document claims the priority and benefits of Korean patent application No. 10-2022-0107811, filed on Aug. 26, 2022, which is incorporated by reference in its entirety as part of the disclosure of this patent document.

TECHNICAL FIELD

The technology and implementations disclosed in this patent document generally relate to an image sensing device.

BACKGROUND

An image sensor is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, etc.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing device for effectively blocking an optical black pixel (OBP) region.

In one aspect, an image sensing device is provided to comprise: an effective pixel region including active pixels, each of which generates an imaging pixel signal for image generation through photoelectric conversion of incident light; and an optical black pixel region disposed outside the effective pixel region, and formed to include a plurality of black pixels, each of which generates a black pixel signal for dark current correction in a state in which inflow of the incident light is blocked, wherein the effective pixel region includes a condensing lens layer formed to condense the incident light, and the optical black pixel region includes a dispersion lens layer formed to disperse the incident light.

In another aspect, an image sensing device is provided to include an image pixel region including active pixels, each active pixel configured to include a photoelectric conversion element which generate an imaging pixel signal through a photoelectric conversion of incident light received by the active pixel; and an optical black pixel region disposed separately from the image pixel region and including a plurality of black pixels and a light blocking layer that blocks incident light from entering the black pixels, each black pixel configured to include a photoelectric conversion element that generate a black pixel signal for correcting dark current. The image pixel region may include a condensing lens layer configured to condense the incident light on to the active pixels in the image pixel region, and the optical black pixel region may include a dispersion lens layer configured to disperse the incident light.

In another aspect, an image sensing device is provided to include a substrate layer formed to include an image pixel region that includes pixels which generate imaging pixel signals by sensing incident light, and an optical black pixel region that include black pixels, a color filter layer disposed over a first surface of the substrate layer, a light blocking layer disposed between the substrate layer and the color filter layer in the optical black pixel region to block light from entering the block pixels, and a lens layer disposed over the color filter layer. The lens layer may include a condensing lens layer configured to condense the incident light in the image pixel region, and a dispersion lens layer configured to disperse the incident light in the optical black pixel region.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of an image sensing device that may be used in specific ways to substantially address one or more technical or engineering issues and mitigate limitations or disadvantages encountered in some other image sensing devices. Some implementations of the disclosed technology suggest examples of an image sensing device for more effectively blocking an optical black pixel (OBP) region. The disclosed technology provides various implementations of an image sensing device which can improve the structure of the microlens material layer formed in the optical black pixel (OBP) region to more effectively block light incident upon the optical black pixel (OBP) region.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Figure 1:
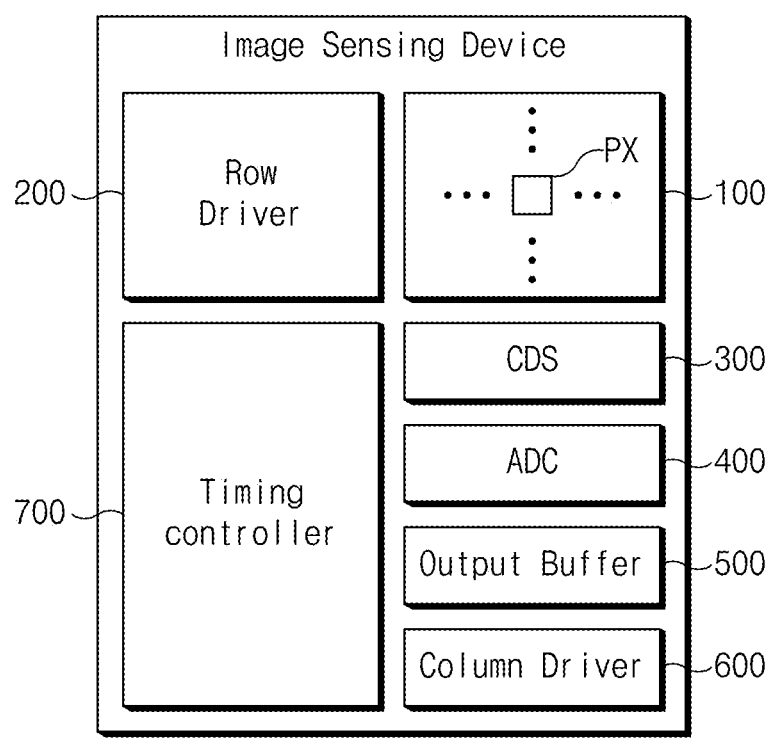
FIG. 1 is a block diagram illustrating an example of an image sensing device based on some implementations of the disclosed technology.

FIG. 1 is a block diagram illustrating an image sensing device based on some implementations of the disclosed technology.

Referring to FIG. 1, the image sensing device may include a pixel array 100, a row driver 200, a correlated double sampler (CDS) 300, an analog-digital converter (ADC) 400, an output buffer 500, a column driver 600, and a timing controller 700. The components of the image sensing device illustrated in FIG. 1 are discussed by way of example only, and this patent document encompasses numerous other changes, substitutions, variations, alterations, and modifications.

The pixel array 100 may include a plurality of unit pixels (PXs) arranged in rows and columns. A plurality of unit pixels (PXs) may include red color filters (Rs), green color filters (Gs), and blue color filters (Bs), and these color filters may be arranged in a Bayer pattern. The pixel array 100 may include an image pixel region for generating an image corresponding to incident light, an optical black pixel (OBP) region for correcting a black level or a dark level for the image pixel region, and a dummy pixel region disposed between the image pixel region and the optical black pixel (OBP) region.

The pixel array 100 may include a lens layer formed over the color filters. The lens layer may be formed to have different shapes in the image pixel region, the dummy pixel region, and the optical black pixel (OBP) region. Specifically, in some implementations, the lens layer may be formed in a shape of dispersing light incident upon the optical black pixel (OBP) region. Detailed formats of the lens layer will be described later.

The pixel array 100 may receive driving signals (for example, a row selection signal, a reset signal, a transmission (or transfer) signal, etc.) from the row driver 200. Upon receiving the driving signal, the unit pixels (PXs) may be activated to perform the operations corresponding to the row selection signal, the reset signal, and the transfer signal.

The row driver 200 may activate the pixel array 100 to perform certain operations on the unit pixels in the corresponding row based on control signals provided by controller circuitry such as the timing controller 700. In some implementations, the row driver 200 may select one or more pixel groups arranged in one or more rows of the pixel array 100. The row driver 200 may generate a row selection signal to select one or more rows from among the plurality of rows. The row driver 200 may sequentially enable the reset signal and the transfer signal for the unit pixels arranged in the selected row. The pixel signals generated by the unit pixels arranged in the selected row may be output to the correlated double sampler (CDS) 300.

The correlated double sampler (CDS) 300 may remove undesired offset values of the unit pixels using correlated double sampling. In one example, the correlated double sampler (CDS) 300 may remove the undesired offset values of the unit pixels by comparing output voltages of pixel signals (of the unit pixels) obtained before and after photocharges generated by incident light are accumulated in the sensing node (i.e., a floating diffusion (FD) node). As a result, the CDS 300 may obtain a pixel signal generated only by the incident light without causing noise. In some implementations, upon receiving a clock signal from the timing controller 700, the CDS 300 may sequentially sample and hold voltage levels of the reference signal and the pixel signal, which are provided to each of a plurality of column lines from the pixel array 100. That is, the CDS 300 may sample and hold the voltage levels of the reference signal and the pixel signal which correspond to each of the columns of the pixel array 100. In some implementations, the CDS 300 may transfer the reference signal and the pixel signal of each of the columns as a correlate double sampling (CDS) signal to the ADC 400 based on control signals from the timing controller 700.

The ADC 400 is used to convert analog CDS signals received from the CDS 300 into digital signals. In some implementations, the ADC 400 may be implemented as a ramp-compare type ADC. The analog-to-digital converter (ADC) 400 may compare a ramp signal received from the timing controller 700 with the CDS signal received from the CDS 300, and may thus output a comparison signal indicating the result of comparison between the ramp signal and the CDS signal. The analog-to-digital converter (ADC) 400 may count a level transition time of the comparison signal in response to the ramp signal received from the timing controller 700, and may output a count value indicating the counted level transition time to the output buffer 500.

The output buffer 500 may temporarily store column-based image data provided from the ADC 400 based on control signals of the timing controller 700. The image data received from the ADC 400 may be temporarily stored in the output buffer 500 based on control signals of the timing controller 700. The output buffer 500 may provide an interface to compensate for data rate differences or transmission rate differences between the image sensing device and other devices.

The column driver 600 may select a column of the output buffer 500 upon receiving a control signal from the timing controller 700, and sequentially output the image data, which are temporarily stored in the selected column of the output buffer 500. In some implementations, upon receiving an address signal from the timing controller 700, the column driver 600 may generate a column selection signal based on the address signal, may select a column of the output buffer 500 using the column selection signal, and may control the image data received from the selected column of the output buffer 500 to be output as an output signal.

The timing controller 700 may generate signals for controlling operations of the row driver 200, the ADC 400, the output buffer 500 and the column driver 600. The timing controller 700 may provide the row driver 200, the column driver 600, the ADC 400, and the output buffer 500 with a clock signal required for the operations of the respective components of the image sensing device, a control signal for timing control, and address signals for selecting a row or column. In some implementations, the timing controller 700 may include a logic control circuit, a phase lock loop (PLL) circuit, a timing control circuit, a communication interface circuit and others.

The image sensing device may include a three-dimensional (3D) stack structure in which a first semiconductor layer in which the pixel array 100 is formed and a second semiconductor layer in which the CDS 300, the ADC 400, the output buffer 500, the column driver 600, and the timing controller 700 are formed are stacked. Alternatively, the row driver 200, the CDS 300, the ADC 400, the output buffer 500, the column driver 600, and the timing controller 700 may be disposed outside the pixel array 100 within the same semiconductor layer as that of the pixel array 100.

Figure 2:
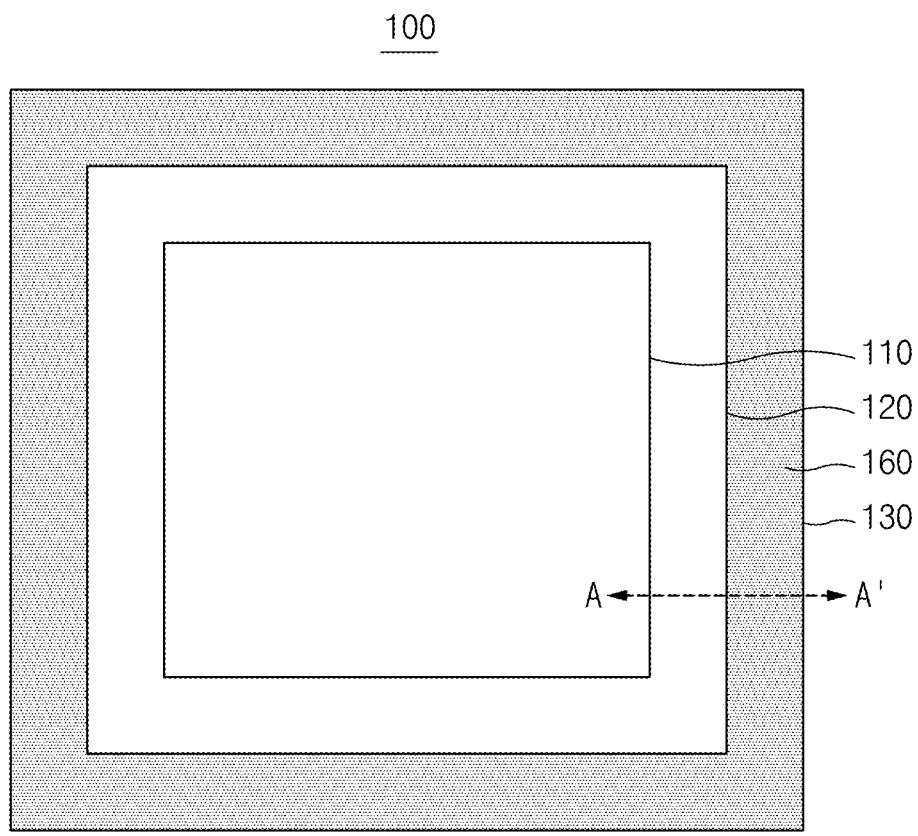
FIG. 2 is a schematic plan view illustrating an example of a pixel array shown in FIG. 1 based on some implementations of the disclosed technology.

FIG. 2 is a schematic plan view illustrating an example of a pixel array shown in FIG. 1 based on some implementations of the disclosed technology.

Referring to FIG. 2, the pixel array 100 may include an image pixel region 110, a dummy pixel region 120, and an optical black pixel (OBP) region 130. The image pixel region 110, the dummy pixel region 120, and the optical black pixel (OBP) region 130 are arranged relative to one another.

The image pixel region 110 may be formed in a rectangular shape near or at the center of the pixel array 100, and may include a plurality of active pixels arranged in each of the row and column directions. The active pixels are utilized to capture an image projected onto the image sensing device, for example, by sensing and converting light into electrical signals. The plurality of active pixels may convert incident light into an electrical signal corresponding to the incident light so as to generate imaging pixel signals, thereby forming an image. For example, the plurality of active pixels may include a plurality of red pixels (Rs), a plurality of green pixels (Gs), and a plurality of blue pixels (Bs). The red pixels (Rs) may generate photocharges corresponding to incident light of a red spectrum region. The green pixels (Gs) may generate photocharges corresponding to incident light of a green spectrum region. The blue pixels (Bs) may generate photocharges corresponding to incident light of a blue spectrum region. In addition, each of the active pixels may include a photoelectric conversion element, a transfer transistor, a reset transistor, a source follower transistor, and a selection transistor.

The dummy pixel region 120 may be located outside the image pixel region 110 adjacent to the image pixel region 110. The dummy pixel region 120 may include a plurality of dummy pixels having the same structure as the active pixels, and the dummy pixels may be consecutively arranged in the row and column directions. The dummy pixels included in the dummy pixel region 120 may be distinguished from the active pixels in the image pixel region 110 in terms of the operations as not sensing and converting light into the electrical signals. The dummy pixel region 120 is disposed between the image pixel region 110 and the optical black pixel (OBP) region 130 to compensate for undesired characteristics of the image sensing device 100. For example, by forming the dummy pixel region 120 between the image pixel region 110 and the optical black pixel (OBP) region 130, the area having the pixels with the same structure as the active pixels in the image pixel region 110 can be extended to a region outside of the image pixel region 110, which can help to solve the problems caused by a step difference that is generated between the image pixel region 110 and the optical black pixel (OBP) region 130 by a light blocking layer 160 formed in the optical black pixel (OBP) region 130.

The optical black pixel (OBP) region 130 may be located outside the dummy pixel region 120. The optical black pixel (OBP) region 130 may include a plurality of unit pixels (hereinafter referred to as black pixels). The black pixels refer to pixels that are shielded from light that is incident upon a surface of the image sensing device and can be used, for example, for noise correction, and so on. The black pixels may be configured to generate black pixel signals without any incident light for correcting a black level or a dark level for the image pixel region 110. The image sensing device 100 may correct a dark current for the active pixels of the image pixel region 110 based on black pixel signals (i.e., dark current) output from black pixels of the optical black pixel (OBP) region 130 when incident light is blocked. The optical black pixel (OBP) region 130 may include a light blocking layer 160 for blocking light from being introduced into the black pixels. In this case, the light blocking layer 160 may be formed under the color filters, and may include metal such as tungsten (W) or copper (Cu).

The lens layer may be formed in each of the image pixel region 110, the dummy pixel region 120, and the optical black pixel (OBP) region 130. The structure of the surface (light incidence surface) upon which light is incident in the lens layer may be different depending on the location of the light incident surface. Thus, the light incidence surface has different shapes in the image pixel region 110, the dummy pixel region 120, and the optical black pixel (OBP) region 130. Detailed shapes of the lens layers will be described later.

Although FIG. 2 shows an embodiment in which the dummy pixel region 120 and the optical black pixel (OBP) region 130 are formed to surround the image pixel region 110 in a frame shape, other implementations are also possible. For example, the dummy pixel region 120 and the optical black pixel (OBP) region 130 may be formed at one side of the image pixel region 110 in a horizontal or vertical direction. In addition, the sizes of the dummy pixel region 120 and the optical black pixel (OBP) region 130 may be determined based on process parameters.

Figure 3:
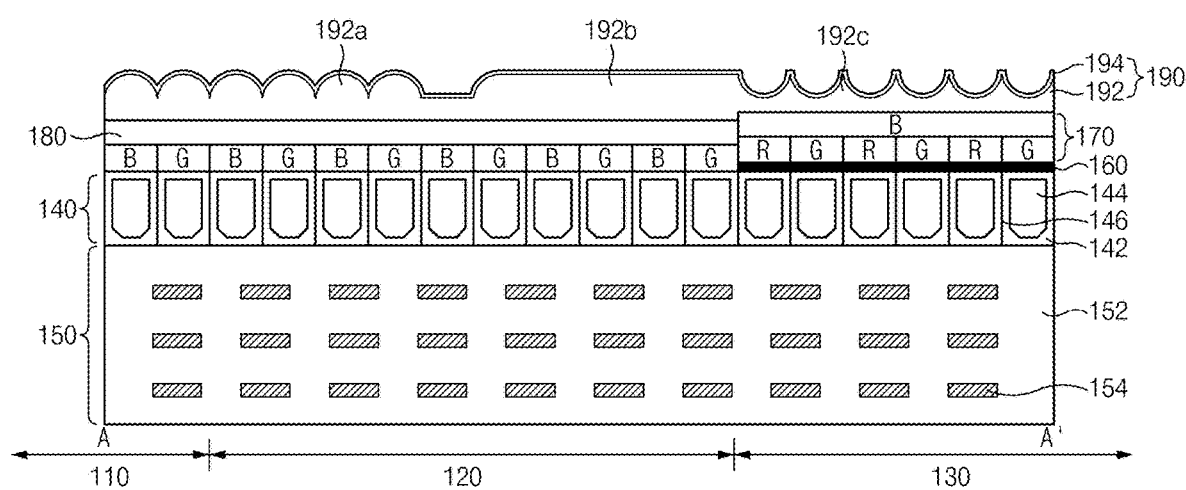
FIG. 3 is a cross-sectional view illustrating an example of a pixel array taken along the line A-A' shown in FIG. 2 based on some implementations of the disclosed technology.

FIG. 3 is a cross-sectional view illustrating an example of the pixel array taken along the line A-A' shown in FIG. 2 based on some implementations of the disclosed technology.

Referring to FIG. 3, the image sensing device 100 may include a substrate layer 140, an interconnect layer 150, a light blocking layer 160, a color filter layer 170, an overcoating layer 180, and a lens layer 190.

The substrate layer 140 may include a semiconductor substrate 142 having a first surface and a second surface opposite to the first surface. The semiconductor substrate 142 may be formed of or include a silicon bulk wafer or an epitaxial wafer. The epitaxial wafer may include a crystalline material layer grown by an epitaxial process on a bulk substrate. The semiconductor substrate 142 is not limited to the bulk wafer or the epitaxial wafer, and may be formed using a variety of wafers, such as a polished wafer, an annealed wafer, a silicon-on-insulator (SOI) wafer, or others. The substrate layer 140 may include photoelectric conversion elements 144 formed in the semiconductor substrate 142 to correspond to the active pixels, the dummy pixels, and the black pixels. In addition, the substrate layer 140 may include device isolation layers 146 disposed between the photoelectric conversion elements 144 in the semiconductor substrate 142.

Each of the photoelectric conversion elements 144 may include a photodiode, a phototransistor, a photogate, or a pinned photodiode. The photoelectric conversion elements 144 may be formed in the semiconductor substrate 142 through an ion implantation process. For example, when the semiconductor substrate 142 is based on a P-type epitaxial wafer, the photoelectric conversion elements 144 may be doped with N-type impurities. The device isolation layer 146 may include a structure in which an insulation material is buried in a trench, or may include a structure in which high-density insulation impurities are implanted into the semiconductor substrate 142.

The substrate layer 140 may be divided into an image pixel region 110, a dummy pixel region 120, and an optical black pixel (OBP) region 130. The photoelectric conversion elements 144 of the image pixel region 110 may generate imaging pixel signals by converting incident light into an electrical signal, and the photoelectric conversion elements 144 of the optical black pixel (OBP) region 130 may generate a black pixel signal (i.e., dark current) caused by internal factors of the substrate layer 140 in a state in which incident light is blocked by the light blocking layer 160.

The interconnect layer 150 may be disposed over the second surface of the substrate layer 140. The interconnect layer 150 may include a plurality of stacked interlayer insulation layers 152, and a plurality of interconnects (such as metal interconnects) 154 stacked in the interlayer insulation layers 152. The interlayer insulation layers 152 may include at least one of an oxide layer and a nitride layer. Each interconnect 154 may include at least one of aluminum (Al), copper (Cu), and tungsten (W). The plurality of interconnects 154 may be electrically coupled to each other through contacts (not shown), and may be electrically coupled to logic elements.

A support substrate (not shown) for preventing the substrate layer 140 from being bent by thinning of the substrate layer 140 may be formed under the interconnect layer 150. The support substrate may be adhered to the interconnect layer 150 by an adhesive layer. The support substrate may include a semiconductor substrate, a glass substrate, and a plastic substrate. Alternatively, a lower substrate layer (not shown) including logic circuits such as the row driver 200, the CDS 300, the ADC 400, the output buffer 500, the column driver 600, and the timing controller 700 may be stacked under the interconnect layer 150.

The light blocking layer 160 may be disposed in the optical black pixel (OBP) region 130 on the substrate layer 140 such that the light blocking layer 160 is in contact with the first surface of the substrate layer 140. The light blocking layer 160 may block light from being incident upon the photoelectric conversion element 144 of the optical black pixel (OBP) region 130. The light blocking layer 162 may include, in some implementations, metal such as tungsten (W) or copper (Cu).

The color filter layer 170 may be disposed over the substrate layer 140 in the image pixel region 110 and the dummy pixel region 120. For example, the color filter layer 170 may be disposed over the first surface of the substrate layer 140 in each of the image pixel region 110 and the dummy pixel region 120, and may be disposed over the light blocking layer 160 in the optical black pixel (OBP) region 130. The color filter layer 170 may include a plurality of red color filters (Rs), a plurality of green color filters (Gs), and a plurality of blue color filters (Bs). Each red color filter (R) may transmit only red light from among RGB lights of visible light while blocking light in other colors. Each green color filter (G) may transmit only green light from among RGB lights of visible light while blocking light in other colors. Each blue color filter (B) may transmit only blue light from among RGB lights of visible light while blocking light in other colors. A grid structure (not shown) for preventing crosstalk of incident light may be formed between adjacent color filters. The grid structure may be formed simultaneously with formation of the light blocking layer 160.

In the image pixel region 110 and the dummy pixel region 120, the color filters may be arranged in a Bayer pattern and may be arranged as a single layer having the same thickness (height).

In the optical black pixel (OBP) region 130, the color filters may be configured in different ways. In some implementations, the color filters in the OPB region 130 may be different from the color filter layers in the image pixel region 110 and the dummy pixel region 120 and may be formed in a structure in which two filter layers are stacked. For example, as shown in the example in FIG. 3, in the optical black pixel (OBP) region 130, a lower filter layer may be formed to have a pattern in which the red color filter (R) and the green color filter (G) are alternately arranged, and an upper filter layer may be formed in a shape in which the blue color filter (B) covers the lower red and green filter layer. Alternatively, the lower filter layer may be arranged in a Bayer pattern with red, green and blue filters as in color filters in the image pixel region 110 and the dummy pixel region 120, and the upper filter layer may be formed such that the blue color filter (B) covers the lower filter layer with red, green and blue filters in the Bayer pattern.

The over-coating layer 180 may be disposed over the color filter layer 180 in the image pixel region 110 and the dummy pixel region 120. The over-coating layer 180 may prevent irregular or diffused reflection of incident light to suppress flare characteristics. In addition, the over-coating layer 180 may compensate for a step difference between the color filters, so that the over-coating layer 180 may allow a plurality of condensing lens layers 192a to have a constant height in each of the image pixel region 110 and the dummy pixel region 120. The over-coating layer 180 may be formed of or include a light transmissive material as in the microlens layer 192.

The lens layer 190 may be disposed over the over-coating layer 180 and the color filter layer 170. For example, the lens layer 190 may be disposed over the over-coating layer 140 in the image pixel region 110 and the dummy pixel region 120, and may be disposed over the color filter layer 170 in the optical black pixel (OBP) region 130.

The lens layer 190 may include a microlens layer 192 and an anti-reflection layer 194. The microlens layer 192 may be formed in a manner that the surface (light incidence surface) upon which light is incident is formed to have different structures according to where the microlenses are located in the microlens layer 192. For example, the microlens layer 192 may include a condensing lens layer 192a formed in the image pixel region 110, a planarization lens layer 192b formed in the dummy pixel region 120, and a dispersion lens layer 192c formed in the optical black pixel (OBP) region 130.

The condensing lens layer 192a may include a plurality of planoconvex lenses, each of which has a convex light incidence surface and a flat light emission surface. The planarization lens layer 192b may include a lens in which both the light incidence surface and the light emission surface are flat. The dispersion lens layer 192c may include a plurality of planoconcave lenses, each of which has a concave light incidence surface and a flat light emission surface. Each of the planoconvex lenses of the condensing lens layer 192a may be formed for each active pixel, and each of the planoconcave lens of the dispersion lens layer 192c may be formed to correspond to at least one black pixel. The condensing lens layer 192a may be formed to extend from the image pixel region 110 to a partial region of the dummy pixel region 120.

Figure 4A:
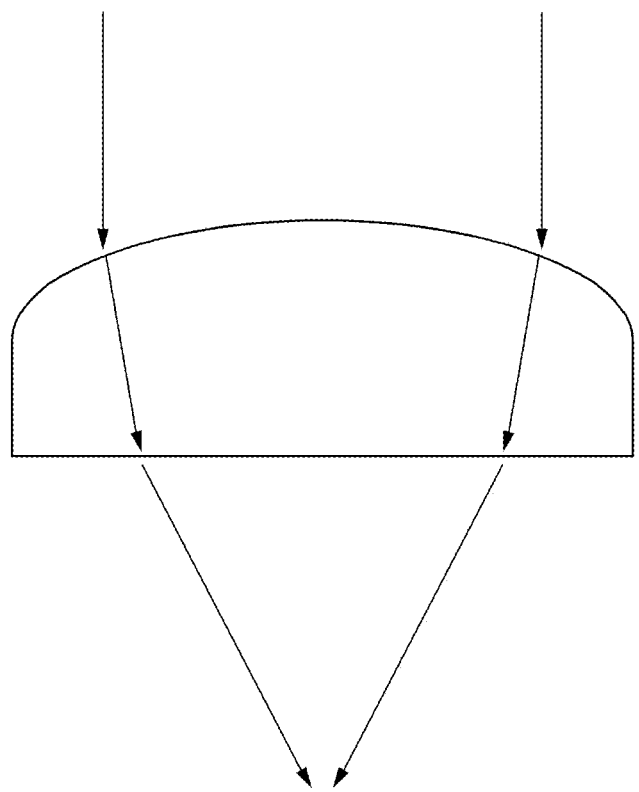
FIG. 4A is a view illustrating an example of a state in which light is collected through a planoconvex lens based on some implementations of the disclosed technology.
Figure 4B:
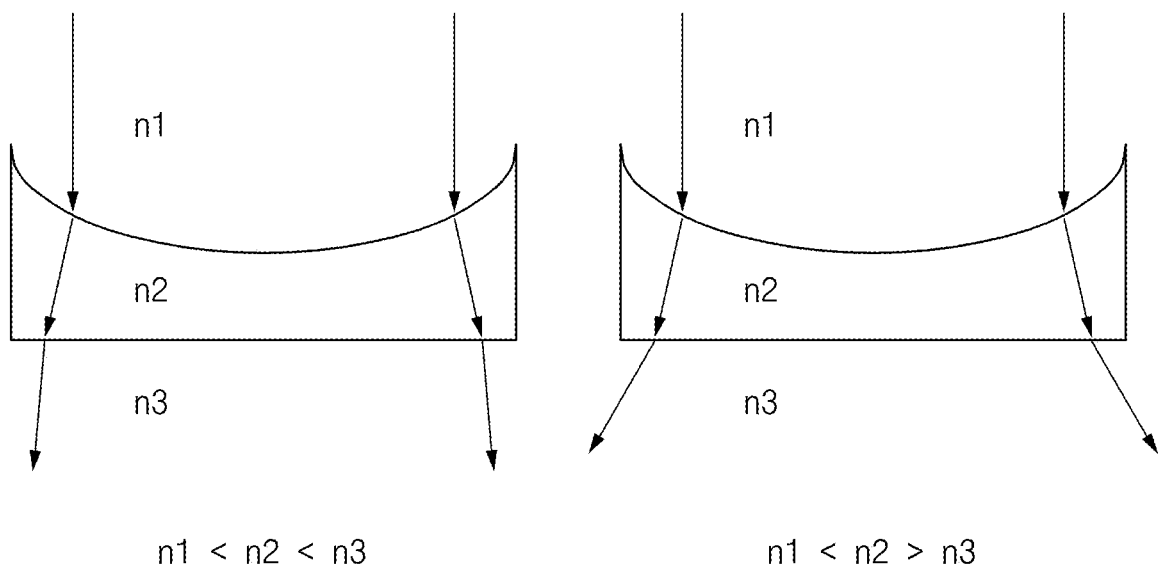
FIG. 4B is a view illustrating an example of a state in which light is dispersed through a planoconcave lens based on some implementations of the disclosed technology.

FIG. 4A is a view illustrating an example of a state in which light is collected through the planoconvex lens based on some implementations of the disclosed technology. FIG. 4B is a view illustrating an example of a state in which light is dispersed through the planoconcave lens based on some implementations of the disclosed technology.

In the image pixel region 110, as shown in FIG. 4A, the planoconvex lenses of the condensing lens layer 192a may converge incident light onto the photoelectric conversion elements of the corresponding active pixels, thereby improving photoelectric efficiency of the active pixels. In the optical black pixel (OBP) region 130, as shown in FIG. 4B, the planoconcave lenses of the dispersion lens layer 192c may disperse the incident light to prevent light from being concentrated. Thus, in some implementations, light rays incident upon the optical black pixel (OBP) region 130 may be primarily dispersed by the planoconcave lenses, and light rays scattered by the planoconcave lenses may be secondarily absorbed by the light blocking layer 160. Accordingly, the image sensing device based on some implementations of the disclosed technology can more effectively block incident light from flowing into the photoelectric conversion elements of the black pixels.

The degree or ratio of the dispersed incident light dispersed by the dispersion lens layer 192c to the incident light introduced to the dispersion lens layer 192c may be adjusted by adjusting a curvature, a refractive index, etc. of the planoconcave lens. For example, as shown in FIG. 4B, when a refractive index of a material included in the planoconcave lens material is set to 'n2', a refractive index of a material disposed on the light incidence surface of the planoconcave lens is set to 'n1', and a refractive index of a material disposed below the light incidence surface of the planoconcave lens is set to 'n3', the refractive index of n2 is adjusted to be higher or lower than the refractive index of n3 while being adjusted to be higher than the refractive index of n1, so that the degree or ratio of light dispersion in the planoconcave lenses can be adjusted.

The anti-reflection layer 194 may be disposed over the microlens layer 192 to protect the microlens layer 192, and may prevent incident light from being reflected by the microlens layer 192. The anti-reflection layer 194 may be formed of or include a light transmissive material having a refractive index smaller than that of the microlens layer 192.

A planarization layer (not shown) may be further formed not only between the substrate layer 140 and the color filter layer 170, but also between the light blocking layer 160 and the color filter layer 170.

Figure 5:
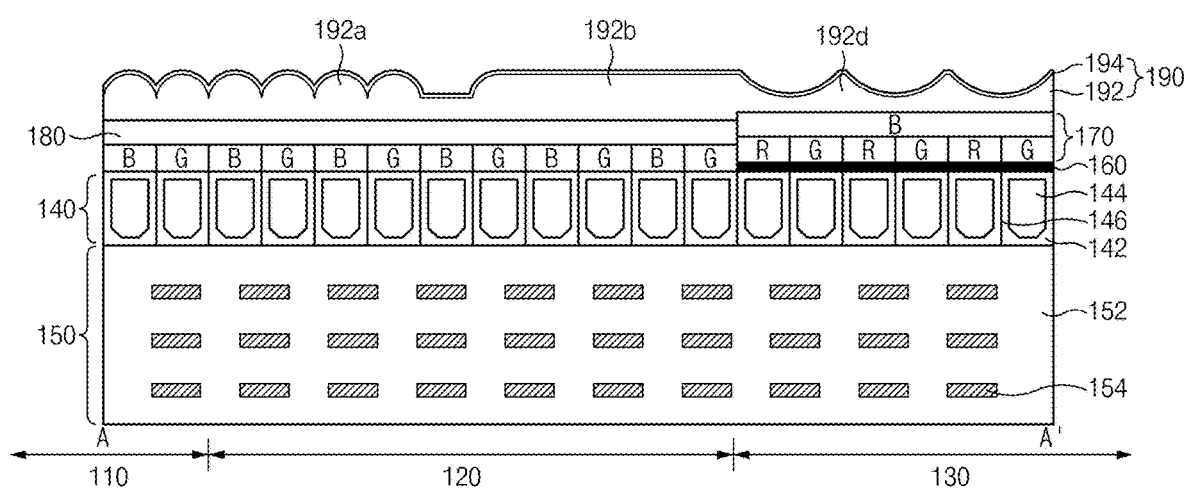
FIG. 5 is a cross-sectional view illustrating another example of a pixel array taken along the line A-A' shown in FIG. 2 based on some implementations of the disclosed technology.

FIG. 5 is a cross-sectional view illustrating another example of the pixel array taken along the line A-A' shown in FIG. 2 based on some implementations of the disclosed technology.

Although the embodiment of FIG. 3 shows an exemplary case in which one planoconcave lens is formed for each black pixel for convenience of description, the planoconcave lenses of the dispersion lens layer 192d may be formed to be sufficiently large to cover the plurality of black pixels as shown in FIG. 5. For example, one planoconcave lens may be formed to cover two adjacent black pixels or four adjacent black pixels.

FIGS. 6 to 10 are cross-sectional views illustrating examples of a method for forming the structure of FIG. 3 based on some implementations of the disclosed technology.

Figure 6:
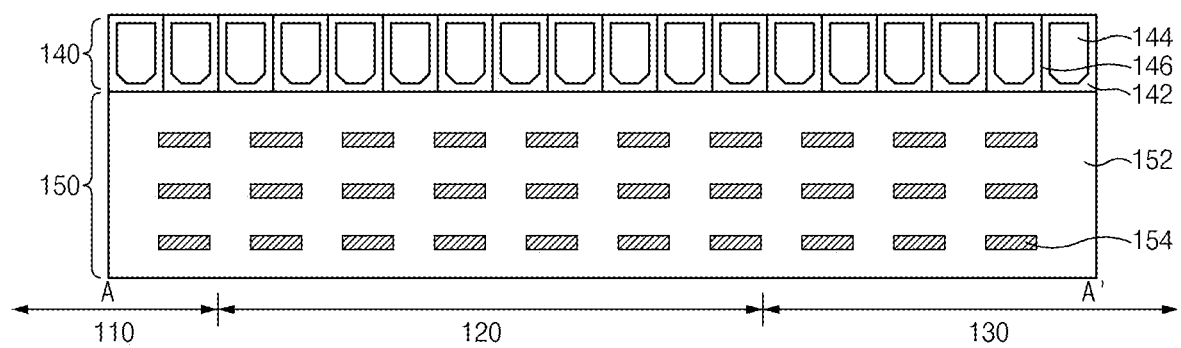
FIGS. 6 to 10 are cross-sectional views illustrating examples of a method for forming the structure of FIG. 3 based on some implementations of the disclosed technology.

Referring to FIG. 6, impurities may be implanted into the semiconductor substrate 142 to form a well region (not shown) and photoelectric conversion elements 144, and device isolation layers 146 by which the photoelectric conversion elements 144 are separated from each other for each unit pixel may be formed.

In a process for forming the device isolation layers 146, the device isolation layers defining an active region may be formed at the second surface of the semiconductor substrate 142, and pixel transistors (e.g., a transfer transistor, a reset transistor, a source follower transistor, and a selection transistor) may be formed in the active region.

Subsequently, the interconnect layer 150 including the interlayer insulation layers 152 and the interconnects 154 may be formed over the second surface of the substrate layer 140.

Figure 7:
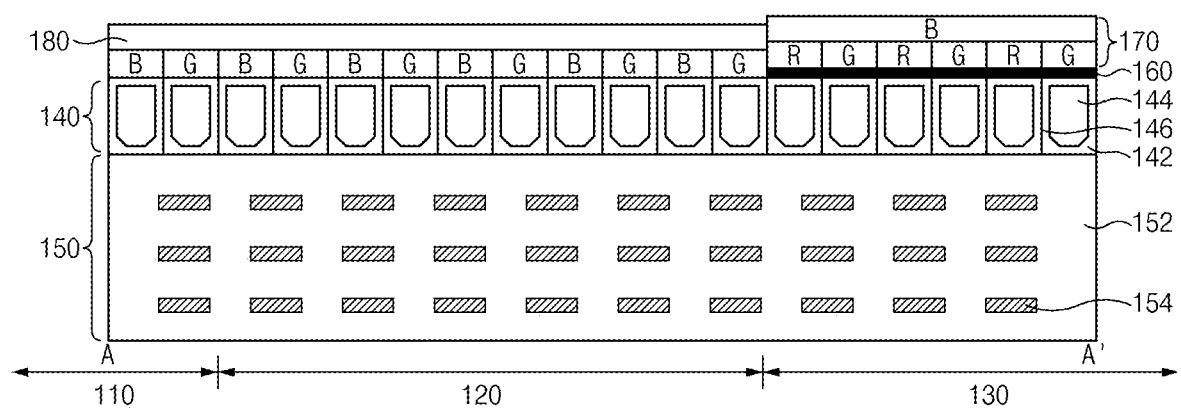

Referring to FIG. 7, the light blocking layer 160 and the color filter layer 170 may be formed over the first surface of the substrate layer 140. For example, after the light blocking layer 160 is formed in the optical black pixel (OBP) region 130, the color filter layer 170 may be formed to cover the substrate layer 140 of each of the image pixel region 110 and the dummy pixel region 120 while covering the light blocking layer 160.

The color filters R, G, and B of the color filter layer 170 may be formed to have a single layer structure in each of the image pixel region 110 and the dummy pixel region 120. In the single layer structure, the color filters R, G, and B of the color filter layer 170 may be arranged in a Bayer pattern. In the optical black pixel (OBP) region 130, the color filters R, G, and B of the color filter layer 170 may be formed in a stacked structure of two filter layers. For example, in the optical black pixel (OBP) region 130, the lower filter layer may be formed to have a pattern in which the red color filter (R) and the green color filter (G) are alternately arranged, and the upper filter layer may be formed in a shape in which the blue color filter (B) covers the lower filter layer. Alternatively, the lower filter layer may be arranged in a Bayer pattern, and the upper filter layer may be formed such that the blue color filter (B) covers the lower filter layer.

Figure 8:
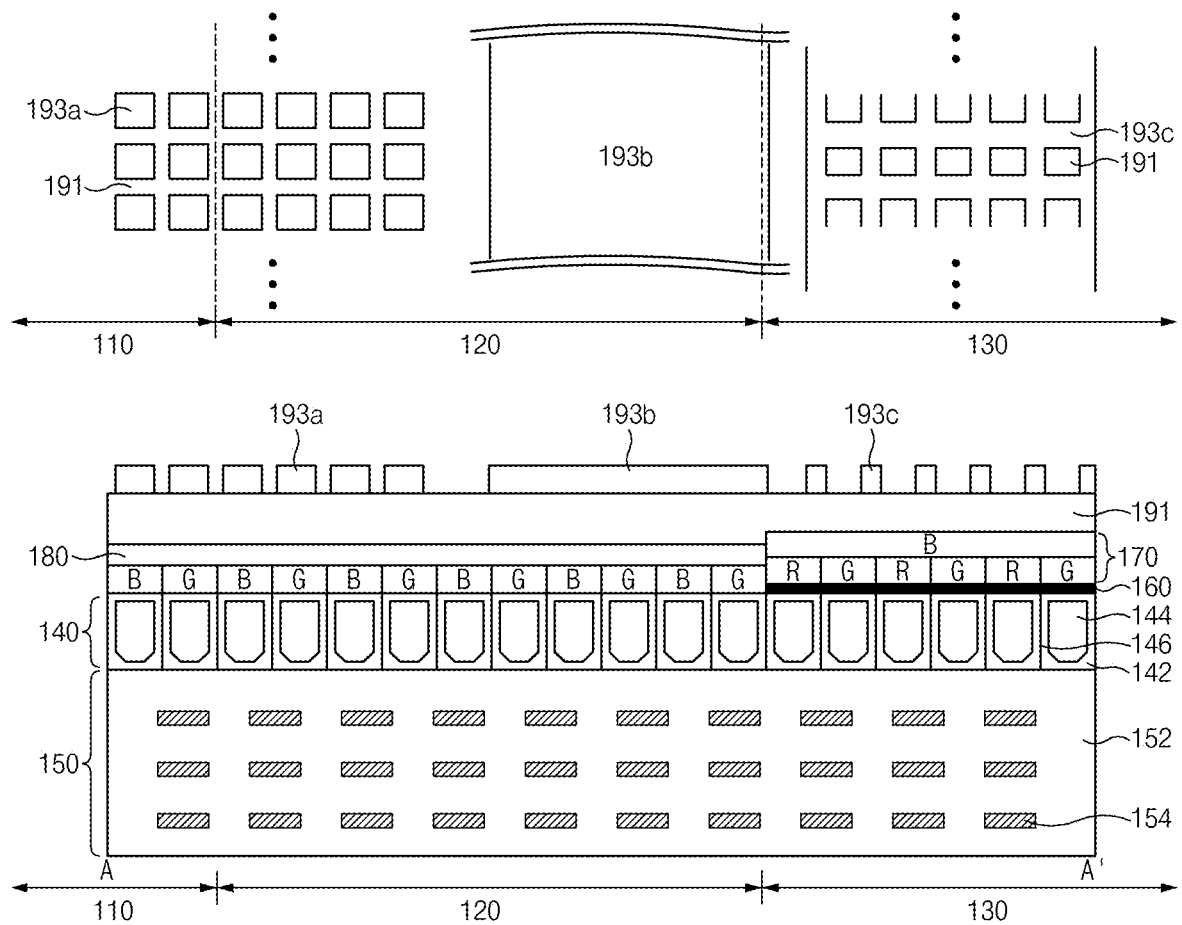

Subsequently, the over-coating layer 180 may be formed over the color filter layer 170 of each of the image pixel region 110 and the dummy pixel region 120. Referring to FIG. 8, a microlens material layer 191 may be formed over the over-coating layer 180 and the color filter layer 170 to cover the image pixel region 110, the dummy pixel region 120, and the optical black pixel (OBP) region 130.

Subsequently, first to third mask patterns 193a to 193c may be formed over the microlens material layer 191. For example, after a photoresist layer is formed over the microlens material layer 191, the first to third mask patterns 193a to 193c may be formed through exposure and development processes.

In this case, the first mask pattern 193a serving as a mask pattern for forming planoconvex lenses of the condensing lens layer 192a may include a plurality of island patterns disposed to overlap the active pixels and the center portion of some dummy pixels. The second mask pattern 193b serving as a mask pattern for forming the planarization lens layer 192b formed in the dummy pixel region 120 may be formed in a frame shape covering a partial region of the dummy pixel region 120. The third mask pattern 193c serving as a mask pattern for forming planoconcave lenses of the dispersion lens layer 192c may be formed in a grid shape that overlaps the device isolation layer 146 in the optical black pixel (OBP) region 130. The third mask pattern 193c may be formed to have a smaller width than the first mask pattern 193a.

Figure 9:
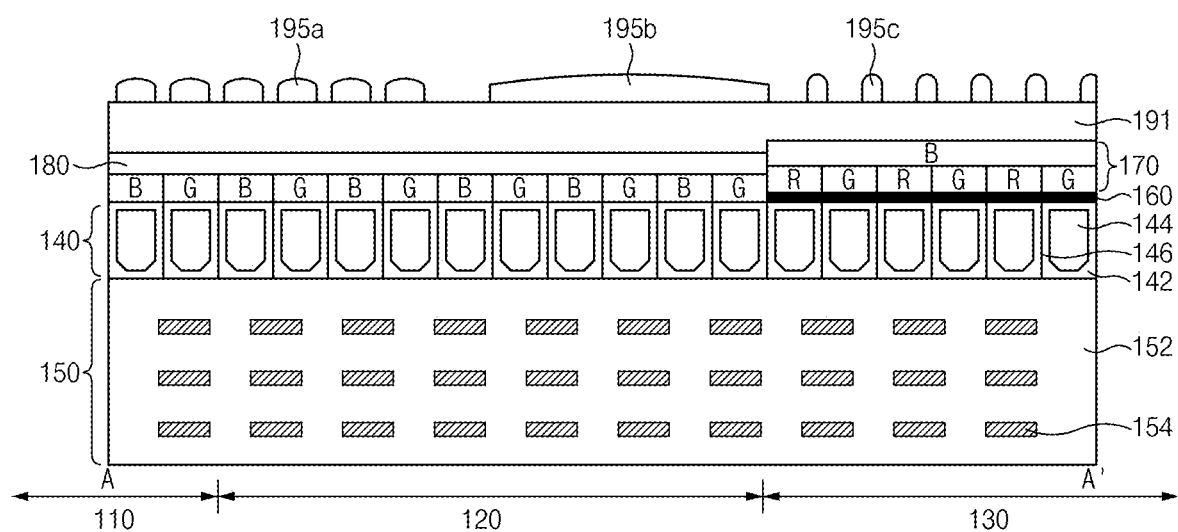

Referring to FIG. 9, a reflow process may be performed on the first to third mask patterns 193a to 193c so as to form first to third reflow patterns 195a to 195c.

The reflow process may be performed based on, for example, blank exposure using a stepper. When the mask patterns 193a to 193c are irradiated with light having a predetermined wavelength through the stepper, PAC (Photo Active Compound) components present in the mask patterns 193a to 193c may be decomposed. Thereafter, the resultant mask patterns may be annealed such that the reflow process can be smoothly performed.

Figure 10:
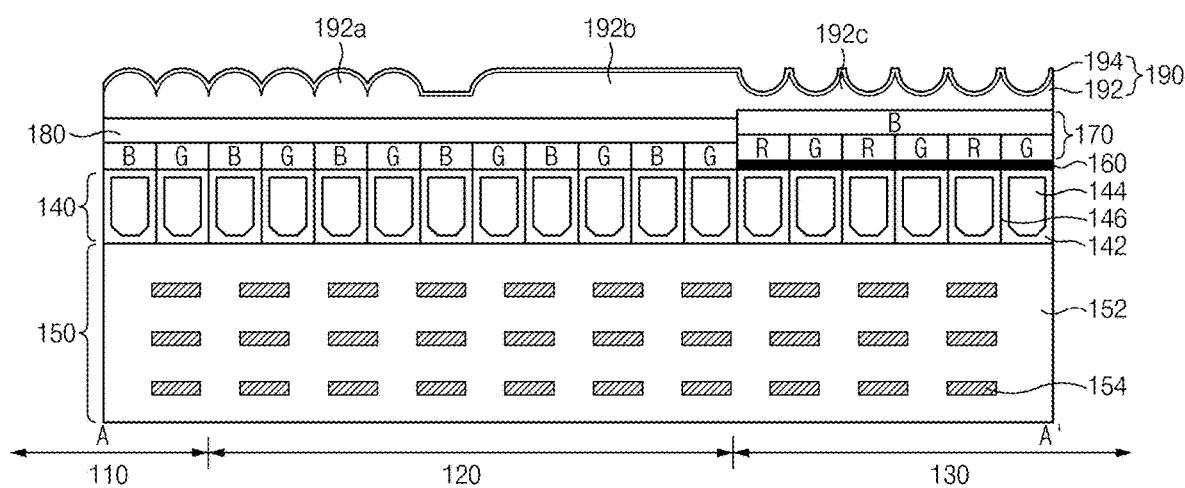

Referring to FIG. 10, an etchback process may be performed using the first to third reflow patterns 195a to 195c as masks, so that the microlens layer 192 including the condensing lens layer 192a, the planarization lens layer 192b, and the dispersion lens layer 192c can be formed. In this case, the etchback process may be performed until all of the first to third reflow patterns 195a to 195c are removed.

Alternatively, when the microlens material layer 191 is formed of or include a photoresist material, a thermal reflow process is also performed on the microlens material layer 191 using the first to third reflow patterns 195a to 195c as masks, resulting in formation of the microlens layer 192.

Alternatively, the reflow process may be performed using the first and second reflow patterns 195a and 195b as masks in the image pixel region 110 and the dummy pixel region 120, and a plasma etching process may be performed using the third reflow pattern 195c as a mask in the optical black pixel (OBP) region 130, resulting in formation of the microlens layer 192.

After the microlens layer 192 is formed, the anti-reflection layer 194 may be formed over the microlens layer 192.

As is apparent from the above description, the image sensing device based on some implementations of the disclosed technology may improve the structure of the microlens material layer formed in the optical black pixel (OBP) region to more effectively block light incident upon the optical black pixel (OBP) region.

The embodiments of the disclosed technology may provide a variety of effects capable of being directly or indirectly recognized through the above-mentioned patent document.

Although a number of illustrative embodiments have been described, it should be understood that various modifications or enhancements of the disclosed embodiments and other embodiments can be devised based on what is described and/or illustrated in this patent document.

What is claimed is:

1. An image sensing device comprising:
an image pixel region including active pixels, each active pixel configured to include a photoelectric conversion element which generate an imaging pixel signal through a photoelectric conversion of incident light received by the active pixel; and
an optical black pixel region disposed separately from the image pixel region, and including a plurality of black pixels and a light blocking layer that blocks incident light from entering the black pixels, each black pixel configured to include a photoelectric conversion element that generate a black pixel signal for correcting an effect of a dark current,
wherein
the image pixel region includes a condensing lens layer configured to condense the incident light on to the active pixels in the image pixel region, and
the optical black pixel region includes a dispersion lens layer located over the plurality of black pixels and configured to disperse the incident light and a color filter layer disposed between the dispersion lens layer and the plurality of black pixels.

2. The image sensing device according to claim 1, wherein the dispersion lens layer includes a plurality of planoconcave lenses having a curvature and a refractive index and wherein an amount of incident light dispersed by the dispersion lens layer is determined based on the curvature and the refractive index.

3. The image sensing device according to claim 1, wherein the dispersion lens layer includes:
a plurality of planoconcave lenses, each planoconcave lens having a concave surface through which the incident light is introduced into a planoconcave lens and a flat surface through which the incident light is emitted from the planoconcave lens.

4. The image sensing device according to claim 3, wherein:
the plurality of planoconcave lenses is disposed to correspond to at least one black pixel.

5. The image sensing device according to claim 3, further comprising:
an anti-reflection layer disposed over the plurality of planoconcave lenses and having a smaller refractive index than the plurality of planoconcave lenses.

6. The image sensing device according to claim 3, further comprising:
an anti-reflection layer disposed over the condensing lens layer and the dispersion lens layer and including a light transmissive material.

7. The image sensing device according to claim 1, wherein the condensing lens layer includes:
a plurality of planoconvex lenses, each planoconvex lens having a convex surface through which the incident light is introduced into a planoconcave lens and a flat surface through which the incident light is emitted from the planoconcave lens.

8. The image sensing device according to claim 7, wherein:
each of the plurality of planoconvex lenses is disposed for each active pixel.

9. The image sensing device according to claim 1, further comprising:
a dummy pixel region disposed between the image pixel region and the optical black pixel region, and formed to include a plurality of pixels and a flat planarization lens layer, wherein each dummy pixel is configured to include a photoelectric conversion element but is not operable to convert sensed light into an electrical signal.

10. The image sensing device according to claim 9, wherein:
the condensing lens layer extends to a portion of the dummy pixel region.

11. The image sensing device according to claim 1, wherein:
the image pixel region includes a first another color filter layer formed as a single layer in which color filters are arranged in a Bayer pattern; and
the color filter layer in the optical black pixel region includes color filters that are stacked over one another.

12. An image sensing device comprising:
a substrate layer formed to include an image pixel region that includes pixels which generate imaging pixel signals by sensing incident light, and an optical black pixel region that include black pixels;
a color filter layer disposed over a first surface of the substrate layer;
a light blocking layer disposed between the substrate layer and the color filter layer in the optical black pixel region to block light from entering the black pixels; and
a lens layer disposed over the color filter layer,
wherein the lens layer includes:
a condensing lens layer configured to condense the incident light in the image pixel region, and
a dispersion lens layer configured to disperse the incident light in the optical black pixel region.

13. The image sensing device according to claim 12, wherein the dispersion lens layer includes a plurality of planoconcave lenses having a curvature and a refractive index and wherein an amount of incident light dispersed by the dispersion lens layer is determined based on the curvature and the refractive index.

14. The image sensing device according to claim 12, further comprising:
an interconnect layer disposed over a second surface opposite to the first surface in the substrate layer, and formed to include an interlayer insulation layer and metal interconnects disposed in the interlayer insulation layer.

15. The image sensing device according to claim 12, wherein the dispersion lens layer includes:
a plurality of planoconcave lenses, each planoconcave lens having a concave surface through which the incident light is introduced into a planoconcave lens and a flat surface through which the incident light is emitted from the planoconcave lens.

16. The image sensing device according to claim 15, further comprising:
an anti-reflection layer disposed over the plurality of planoconcave lenses and having a smaller refractive index than the plurality of planoconcave lenses.

17. The image sensing device according to claim 12, wherein the condensing lens layer includes:
a plurality of planoconvex lenses, each planoconvex lens having a convex surface through which the incident light is introduced into a planoconcave lens and a flat surface through which the incident light is emitted from the planoconcave lens.

18. The image sensing device according to claim 12, wherein the color filter layer includes:
a first color filter layer disposed in the image pixel region, and formed as a single layer in which color filters are arranged in a Bayer pattern; and
a second color filter layer disposed in the optical black pixel region, and formed to include a stacked structure of color filters.

19. The image sensing device according to claim 12, wherein the lens layer includes:
a planarization lens layer disposed between the condensing lens layer and the dispersion lens layer, and formed to have a first surface through which the incident light is introduced to the planarization lens layer and a second surface through which the incident light is emitted from the planarization lens layer, the first surface and the second surface being flat.

* * * * *